United States Patent
Yu et al.

(10) Patent No.: US 8,921,893 B2
(45) Date of Patent: Dec. 30, 2014

(54) CIRCUIT STRUCTURE HAVING ISLANDS BETWEEN SOURCE AND DRAIN

(75) Inventors: Chen-Ju Yu, Jiaoxi Township (TW); Chih-Wen Hsiung, Hsinchu (TW); Fu-Wei Yao, Hsinchu (TW); Chun-Wei Hsu, Taichung (TW); Jiun-Lei Jerry Yu, Zhudong Township (TW); Fu-Chih Yang, Fengshan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/309,048

(22) Filed: Dec. 1, 2011

(65) Prior Publication Data

US 2013/0140578 A1 Jun. 6, 2013

(51) Int. Cl.
*H01L 29/788* (2006.01)
*H01L 29/778* (2006.01)
*H01L 29/66* (2006.01)

(52) U.S. Cl.
CPC ........ *H01L 29/66462* (2013.01); *H01L 29/778* (2013.01)
USPC ............ 257/194; 257/E29.246; 257/E21.403; 257/E21.407; 438/172

(58) Field of Classification Search
CPC ............ H01L 29/66462; H01L 29/778; H01L 2924/13064
USPC ........... 257/194, E29.246, E21.403, E21.407; 438/172, 604
See application file for complete search history.

(56) References Cited

U.S. PATENT DOCUMENTS

| | | | |
|---|---|---|---|
| 2004/0227211 A1* | 11/2004 | Saito et al. ..................... | 257/578 |
| 2010/0052010 A1* | 3/2010 | Yoon ............................. | 257/103 |
| 2010/0078683 A1* | 4/2010 | Baba et al. .................... | 257/192 |
| 2010/0155780 A1* | 6/2010 | Machida et al. .............. | 257/192 |
| 2013/0075748 A1* | 3/2013 | Bour et al. ....................... | 257/76 |
| 2013/0134435 A1* | 5/2013 | Yu et al. .......................... | 257/76 |
| 2013/0143392 A1* | 6/2013 | Romano et al. ............... | 438/478 |

* cited by examiner

*Primary Examiner* — Tom Thomas
*Assistant Examiner* — Christopher M Roland
(74) *Attorney, Agent, or Firm* — Lowe Hauptman & Ham, LLP

(57) ABSTRACT

A circuit structure includes a substrate, an unintentionally doped gallium nitride (UID GaN) layer over the substrate, a donor-supply layer over the UID GaN layer, a gate structure, a drain, and a source over the donor-supply layer. A number of islands are over the donor-supply layer between the gate structure and the drain. The gate structure disposed between the drain and the source. The gate structure is adjoins at least a portion of one of the islands and/or partially disposed over at least a portion of at least one of the islands.

19 Claims, 9 Drawing Sheets

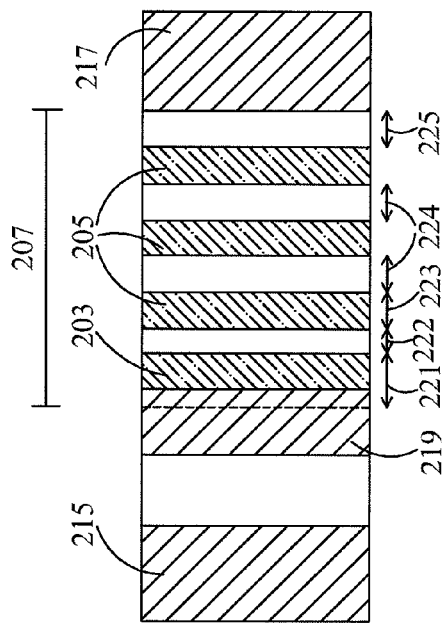
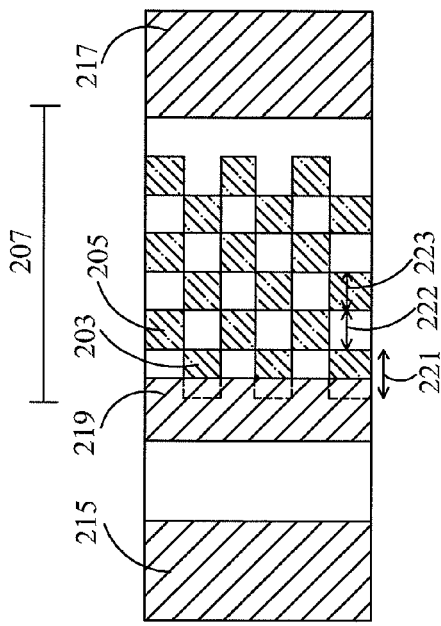

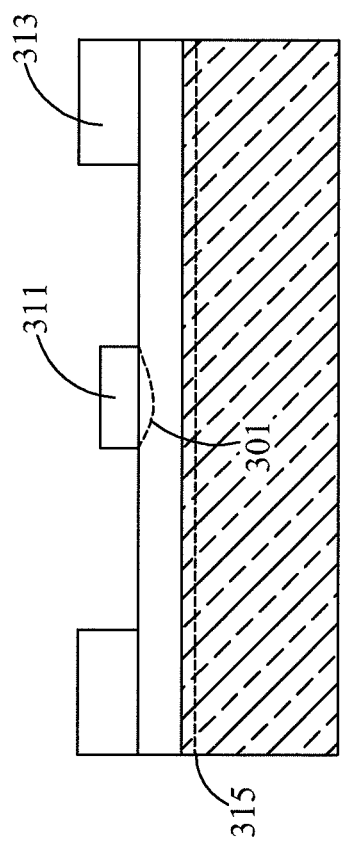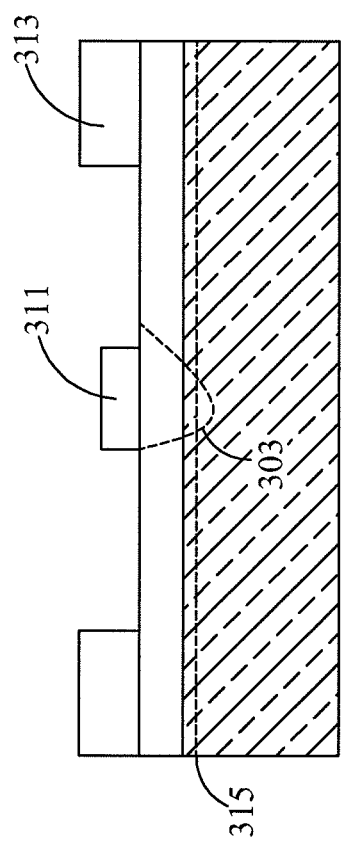
Fig. 3A
Fig. 3B

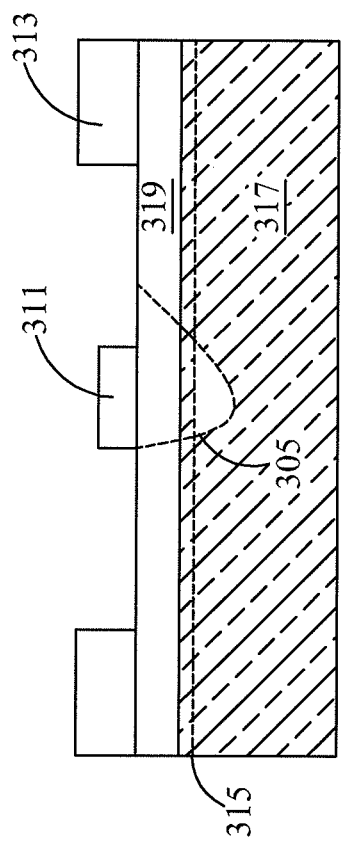
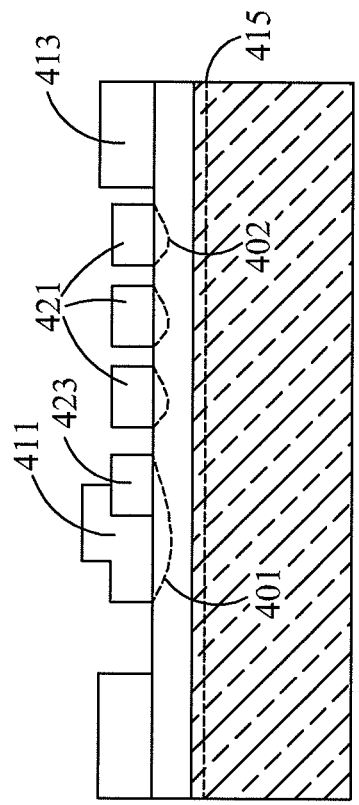
Fig. 3C
Fig. 4A

CIRCUIT STRUCTURE HAVING ISLANDS BETWEEN SOURCE AND DRAIN

TECHNICAL FIELD

This disclosure relates generally to semiconductor circuit manufacturing processes and, more particularly, to a group-III group-V (III-V) compound semiconductor based transistor.

BACKGROUND

Group-III group-V compound semiconductors (often referred to as III-V compound semiconductors), such as gallium nitride (GaN) and its related alloys, have been under intense research in recent years due to their promising applications in power electronic and optoelectronic devices. The large band gap and high electron saturation velocity of many III-V compound semiconductors also make them excellent candidates for applications in high temperature, high voltage, and high-speed power electronics. Particular examples of potential electronic devices employing III-V compound semiconductors include high electron mobility transistor (HEMT) and other heterojunction bipolar transistors.

During operation, a HEMT forms a large surface electric field around the gate edge, which affects the depletion region curve between the gate structure and the drain. While large electric field is one of the benefits of HEMT for use in power applications, the distribution of the depletion region during operation can negatively affect the breakdown voltage for the device. When negative bias is applied to the gate of the HEMT, depletion region curve is formed directly under the gate and causes high surface electric field around the gate edge. The high electric field concentration around the gate reduces breakdown voltage for the device.

In order to improve breakdown voltage (i.e., to increase it), a metallic field plate is sometimes added over or next to the gate structure over the passivation layer between the gate structure and the drain. The field plate modulates the surface electric field distribution reducing the peak electric field, and thus increases the breakdown voltage. However, new structures with high breakdown voltage for III-V compound semiconductor based transistors and methods for forming them continue to be sought.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A to 2E are top views of a HEMT structure in accordance with various embodiments of the present disclosure.

FIGS. 3A to 3C are cross-sectional views of a HEMT depletion regions under different operating conditions.

FIGS. 4A to 4C are cross-sectional views of a HEMT depletion regions in accordance with various embodiments of the present disclosure under different operating conditions.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are illustrative of specific ways to make and use the disclosed embodiments and do not limit the scope of the disclosure.

A novel structure for group-III to group-V (referred to as III-V hereinafter) semiconductor based transistors and methods for forming the structures are provided. Throughout the description, the term "III-V compound semiconductor" refers to compound semiconductor materials comprising at least one group III element and one group-V element. The term "III-N compound semiconductor" refers to a III-V compound semiconductor in which the group V element is nitrogen. Example stages of manufacturing an illustrative embodiment of the present disclosure are discussed. Those skilled in the art will recognize that other manufacturing steps may take place before or after the described stages in order to produce a complete device. Other stages of manufacturing that may substitute some of the example stages may be discussed. Those skilled in the art will recognize that other substitute stages or procedures may be used. Throughout the various views and illustrative embodiments of the present disclosure, like reference numbers are used to designate like elements.

Figure 1A:
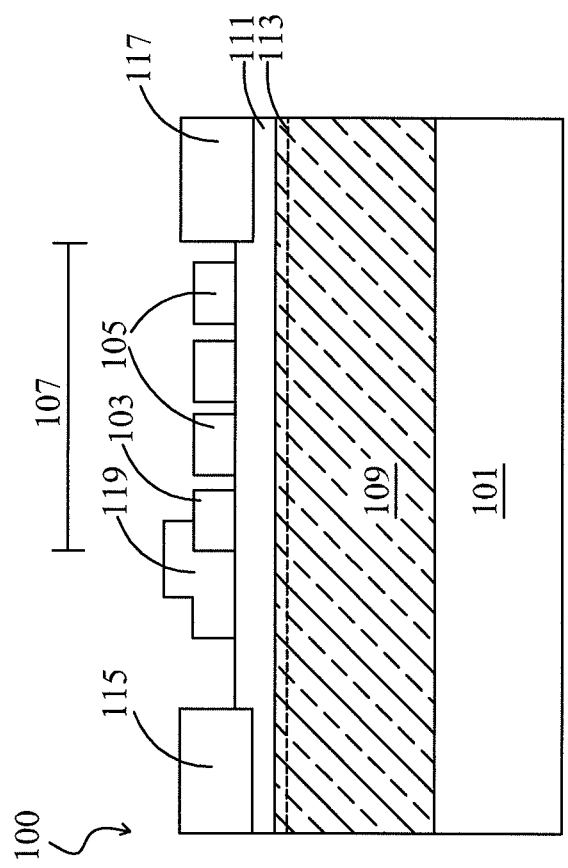
FIG. 1A is a cross sectional view of a high electron mobility transistor (HEMT) structure in accordance with various embodiments of the present disclosure.

The present disclosure provides a structure and a method to form III-V compound semiconductor based transistors having high breakdown voltage. FIG. 1A shows an example power transistor device 100 according to various embodiments of the present disclosure. The power transistor 100 may be a high-electron mobility transistor (HEMT). The HEMT includes a substrate 101, a bulk layer GaN layer 109 over the substrate 101, an active layer 111 over the bulk GaN layer 109, and source 115, drain 117, and gate 119 over the active layer 111. An interface of active layer 111 and bulk GaN layer 109 is a high-electron mobility region 113, also known as a channel layer. In a drift region 107 between the gate 119 and the drain 117, a number of islands 103 and 105 are formed over the active layer. Each of these transistor elements are discussed further below together with methods for forming them.

Figure 1B:
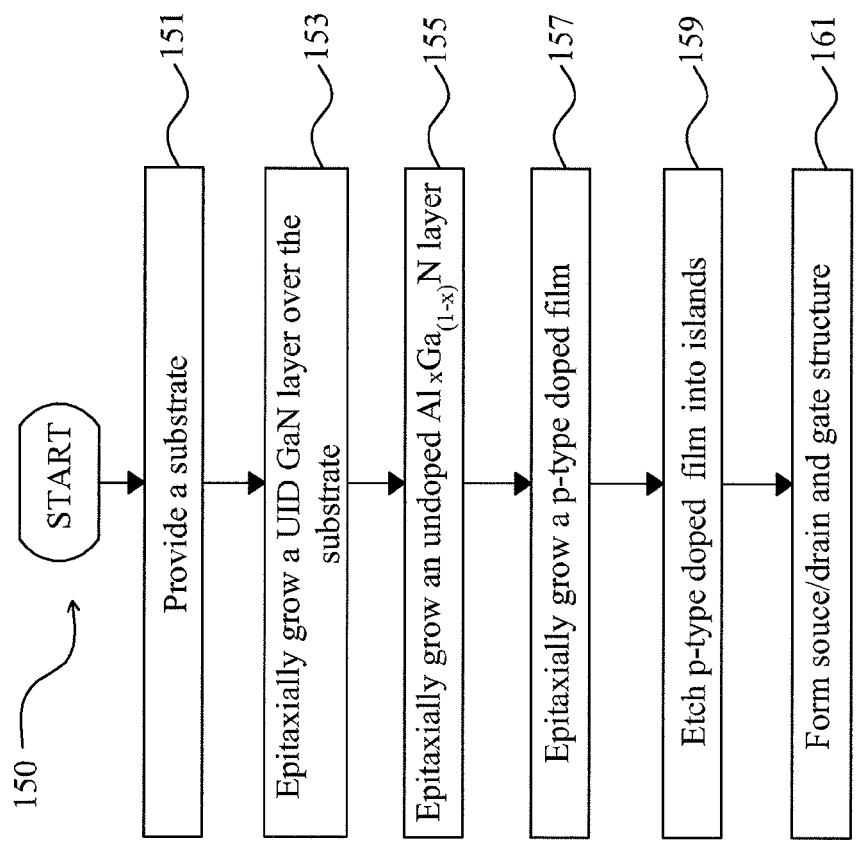
FIG. 1B is a flow chart of a method of forming a HEMT structure in accordance with certain embodiments according to FIG. 1A of the present disclosure.

FIG. 1B shows a flowchart 150 of a method of making the power transistor device 100 of FIG. 1A. In operation 151, a substrate 101 is provided, as shown in FIG. 1A. Although silicon wafers are used, other suitable substrates include silicon carbide and sapphire. A number of layers are grown over the substrate 101 using an epitaxial process. The layers may include a nucleation layer of aluminum nitride, a buffer, and a bulk gallium nitride layer 109 grown over the buffer layer. The bulk gallium nitride layer 109 is a channel layer for the power transistor device 100.

The bulk layer of undoped gallium nitride 109 is epitaxially grown over the substrate, which may include a buffer layer (not shown) in operation 153 of FIG. 1B. The bulk layer of gallium nitride 109 does not include any dopant, but may include contaminants or impurities that are incorporated in the film unintentionally. The bulk layer of gallium nitride may be referred to as unintentionally doped gallium nitride (UID GaN) layer. The UID GaN layer is about 0.5 microns to about 5 micron thick. The bulk GaN layer is grown under high temperature conditions. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and liquid phase epitaxy (LPE). The metal organic vapor phase epitaxy (MOVPE) process uses gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), trimethylalaluminum (TMA), phenyl hydrazine, or other suitable chemical.

FIG. 1A shows an active layer 111 on top of the bulk GaN layer 109. The active layer 111, also referred to as donor-supply layer, is grown on the channel layer 109 in operation 155 of FIG. 1B. An interface is defined between the channel layer 109 and the donor-supply layer 111. A carrier channel 113 of two-dimensional electron gas (2-DEG) is located at the interface, which is discussed in further detail below. In at least one embodiment, the donor-supply 111 refers to an aluminum gallium nitride (AlGaN) layer (also referred to as the AlGaN layer 111). The AlGaN layer 111 has a formula of $Al_xGa_{(1-x)}N$. It has a thickness in a range from about 5 nanometers to about 50 nanometers, wherein x varies between about between about 10% to 100%. In other embodiments, the donor-supply layer 111 may include an AlGaAs layer or AlInP layer.

The AlGaN layer 111 can be epitaxially grown on the GaN layer 109 in operation 155 of FIG. 1B by MOVPE using an aluminum-containing precursor, a gallium-containing precursor, and/or a nitrogen-containing precursor. The aluminum-containing precursor includes Tri-Methyl Aluminum TMA, triethyl Aluminum (TEA), or other suitable chemical. The gallium-containing precursor includes Trimethyl Gallium TMG, Triethyl Gallium TEG, or other suitable chemical. The nitrogen-containing precursor includes ammonia, tertiarybutylamine (TBAm), phenyl hydrazine, or other suitable chemical.

Referring back to FIG. 1A, a band gap discontinuity exists between the AlGaN layer 111 and the GaN layer 109. The electrons from a piezoelectric effect in the AlGaN layer 111 drop into the GaN layer 109, creating a very thin layer 113 of highly mobile conducting electrons in the GaN layer 109. This thin layer 113 is referred to as a two-dimensional electron gas (2-DEG), forming a carrier channel (also referred to as the carrier channel 113). The thin layer 113 of 2-DEG is located at an interface of the AlGaN layer 111 and the GaN layer 109. Thus, the carrier channel has high electron mobility because the GaN layer 109 is undoped or unintentionally doped, and the electrons can move freely without collision or substantially reduced collision with the impurities.

According to various embodiments of the present disclosure, a gate structure 119 partially overlaps one or more islands 103 formed over the AlGaN layer 111 between the gate structure 119 and a drain 117 or at least adjoins at least a portion of one of the islands. The region between the gate structure 119 and the drain 117 is the drift region 107 on which the islands 103 and 105 are formed. The islands 103 and 105 are formed before the gate structure 119 but may be formed before or after a source 115 and drain 117.

In certain embodiments, a portion of the gate structure 119 overlaps a part of the one or more islands 103, as shown in FIG. 1A. In other embodiments, the gate structure 119 covers the entirety of the one or more islands 103 while a portion of the bottom of the gate structure 119 does not contact the one or more islands. In other words, the gate structure 119, the one or more islands 103, or both can partially overlap the other. In still other embodiments, the gate structure 119 adjoins a portion of one or more of the islands without overlapping each other.

According to certain embodiments, the islands 103 and 105 are p-type doped islands. Referring to FIG. 1B, in operation 157 a p-type doped GaN film is grown epitaxially over the AlGaN layer 111. The islands may be p-type doped gallium nitride or aluminum gallium nitride islands. The p-type doping may occur by adding a dopant during the epitaxial growth process. P-type dopant candidates include carbon, iron, magnesium, calcium, beryllium, and zinc. The p-type doping may also be performed by other processes such as ion implantation; however, care must be taken not to incorporate the dopant in underlying layers, which may adversely affect the electrical property of the transistor. The dopant concentration may be about from $1E15/cm^3$ to $1E17/cm^3$.

In other examples, the islands 103 and 105 may also be deposited, for example, using a metal chemical vapor deposition (MCVD) process or a sputtering process, and defined on the AlGaN layer 111. The islands may be p-type doped nickel oxide or zinc oxide. The p-type doping may occur by adding a dopant during the deposition process. P-type dopant candidates include carbon, iron, magnesium, calcium, beryllium, and zinc. The p-type doping may also be performed by other processes such as ion implantation; however, care must be taken not to incorporate the dopant in underlying layers, which may adversely affect the electrical property of the transistor. Note that while the dopant candidates may be the same for the epitaxially grown islands and the deposited islands, but the chemicals used may be different. The dopant concentration may be from about $1E15/cm^3$ to $1E17/cm^3$.

Referring to FIG. 1B, the p-type doped film is deposited in operation 157. Thereafter, a photolithographic process is employed to protect the island portions of the p-type doped film. The p-type doped film is etched into islands in operation 159. In at least one embodiment, a plasma etch process is used to removed unwanted portions of the p-type doped film. In one example, the plasma etch process is a reactive ion etch process employing chlorine containing etchants. In some embodiments, care is taken to not overetch into the donor-supply layer 111.

The light p-type doping of the islands creates p-n junctions at the AlGaN layer 111 surface. During operation, the p-n junctions modulates the surface electric field and reduce effective peak electric field at the gate edge. The lower peak electric field results in a higher breakdown voltage.

According to some embodiments, the islands 103 and 105 are formed of Schottky materials, such as titanium, tungsten, titanium nitride, or titanium tungsten. Other Schottky materials may include nickel, gold, or copper. These materials may be deposited using physical vapor deposition (PVD) processes such as sputtering or electron gun, or using MCVD processes. The materials may be deposited first and then unwanted parts are defined and etched away or be deposited over defined film such as a photoresist and then unwanted parts lifted off with the defined film.

A thickness of the islands 103 and 105 may be about 3 nm to about 100 nm. In some cases, the thickness of the islands 103 and 105 may be about 10 nm or be about 20 nm. The thickness of the islands 103 and 105 depends on the electrical properties and the physical dimensions of the semiconductor structure 100. For example, thin islands 103 and 105 may be used when the bulk gallium nitride layer 109 is thick and the drift region 107 is very large as compared to the region between the gate structure 119 and the source 115. In these circumstances, the breakdown voltage is naturally high and little modulation of the surface electric field may be sufficient for reaching a predetermined breakdown voltage. On the other hand, when the bulk gallium nitride layer 109 is thin or when the bulk layer is of a material with a low critical electrical field (Ec) value, the island 103 and 105 may be thicker. During operation when the drain is subjected to a high voltage, the depletion region formed may extend past a thin gallium nitride layer 109 and interact with the underlying substrate. Similar rationale applies when the distance between the gate structure 119 and the drain 117 is small. During operation when the drain is subjected to a high voltage, the depletion region curve may extend past a short drift region 107. Thus thicker islands 103 and 105 may be used to effectively modulate the surface electrical field. According to various embodiments, island thickness between about 3 nm to 100 nm and a drift region that is at least half the size of the device, i.e., half of the donor-supply layer, form a HEMT with good breakdown voltage at or over 600 volts.

The source 115, drain 117, and gate structures 119 are formed in operation 161 of FIG. 1B. The source feature 115 and a drain feature 117 are disposed on the AlGaN layer 111 and configured to electrically connect to the carrier channel 113. Each of the source feature 115 and the drain feature 117 comprises a corresponding intermetallic compound. The intermetallic compound is at least partially embedded in the AlGaN layer 111 and may be embedded in a top portion of the GaN layer 109. In one example, the intermetallic compound comprises Al, Ti, or Cu. In another example, the intermetallic compound comprises AlN, TiN, $Al_3Ti$ or $AlTi_1N$.

The intermetallic compound may be formed by constructing a patterned metal layer in a recess of the AlGaN layer 111. Then, a thermal annealing process may be applied to the patterned metal layer such that the metal layer, the AlGaN layer 111 and the GaN layer 109 react to form the intermetallic compound. The intermetallic compound contacts the carrier channel 113 located at the interface of the AlGaN layer 111 and the GaN layer 109. Due to the formation of the recess in AlGaN layer 111, the metal elements in the intermetallic compound may diffuse deeper into the AlGaN layer 111 and the GaN layer 109. The intermetallic compound may improve electrical connection and form ohmic contacts between the source/drain features 115 or 117 and the carrier channel 113. In one example, the intermetallic compound is formed in the recess of the AlGaN layer 111 thereby the intermetallic compound has a non-flat top surface. In another example, intermetallic compound overlies a portion of the AlGaN layer 111.

The semiconductor structure 100 also includes a gate structure 119 disposed on the AlGaN layer 111 between the source 115 and drain 117 features. The gate 119 includes a conductive material layer which functions as the gate electrode configured for voltage bias and electrical coupling with the carrier channel 113. In various examples, the conductive material layer may include a refractory metal or its compounds, e.g., tungsten (W), titanium nitride (TiN) and tantalum (Ta). Other commonly used metals in the conductive material layer include nickel (Ni) and gold (Au). The gate structure may include one or many layers.

Figure 2C:
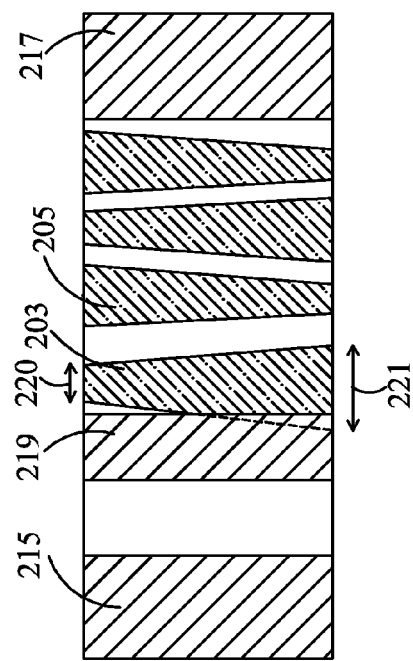

FIGS. 2A to 2D are example top views of various islands in accordance with various embodiments of the present disclosure. FIG. 2A shows a total of four islands 203 and 205 in the drift region, between source 215 and drain 217, with island 203 being partially covered by the gate 219. The edge of island 203 covered by the gate structure 219 is shown as a dotted line. As shown in FIG. 2A, three islands 205 are dispersed between the island 203 and drain 217, although fewer or more islands may be used.

In FIG. 2A, the first island 203 that is partially under the gate structure 219 is the largest island. Islands 205 have the same size. Each island has a width. Island 203 has a width 221. Islands 205 have widths 223. The distance between island 203 and the adjacent island 205 is distance 222. The distances between the islands 205 are distances 224. Finally, a distance between the drain 217 and adjacent island 205 is distance 225. Adequate distance 225 must be maintained to ensure isolation of the drain 217 from an adjacent island 205.

According to certain embodiments, a largest of the islands 203 and 205 is partially disposed under the gate structure 119. While not required for the present disclosure to reduce breakdown voltage of the transistor 100, the island material has the largest effect to modulate surface electric field at the gate edge. Thus, embodiments having larger islands at least partially under the gate structure 119 results in greater reductions of breakdown voltages.

In some embodiments, the islands 203 and 205 are the same sizes and may be equally spaced. In some examples, the widths of adjacent island and drift region 207 not occupied by an island may be between about 3:1 to about 1:3. For example, a ratio of distance 221 to distance 222 may be about 3:1, while a ratio of distance 222 to distance 223 may be about 1:2. A ratio of distance 223 to distance 224 may be about 1:1.

In other embodiments, a sum of total island widths may be compared to the total drift region 207 width. A total island width may be about 40% to about 75% of the total drift region 207 width. In other words a sum of widths 221 and 223s may be compared to the total width of the drift region 207.

In yet other embodiments, a total island area is compared to the drift region area. In FIG. 2A, the features all have the same length so that the widths are a proxy for area. However, the islands need not have same lengths, shapes or sizes. A total island area may be about 40% to about 75% of the total drift region area.

FIG. 2B shows checkered pattern islands 203 and 205 as another example. The islands 203 are again larger than islands 205 (width 221 is larger than width 223), but not all of the gate structure edge overlaps an island 203. This design may be used to smooth the surface electric field. A ratio of an island and adjacent drift region (such as 221/222 or 223/222) that is not occupied by an island may be about 3:1 to about 1:3. Thus, the checkers need not be the same size. As shown in FIG. 2B, the ratio is about 1:1.

FIG. 2C shows trapezoidal islands 203 and 205 as another example. The trapezoidal islands 203 and 205 have a shorter width, such as width 220, and a longer width, such as width 221. The gate structure edge overlaps a portion of the trapezoidal island 203.

Figure 2D:
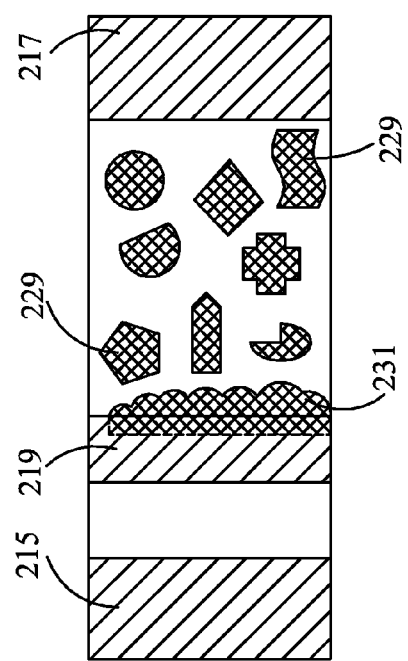

FIG. 2D shows an irregular island distribution. The various islands 229 and 231 are all differently shaped and may be irregularly shaped. In this example the overall island area, shown as cross hatched regions, is compared to the total drift region area. A total island area may be about 40% to about 75% of the total drift region area. Another comparison is the total island area, shown as cross hatched regions, to the drift region that is not occupied by an island, shown as hatched regions. This ratio may be about 30% to about 300%.

Figure 2E:
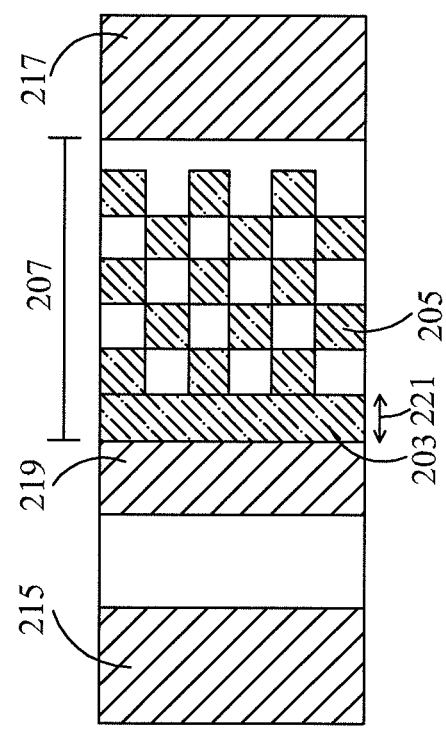

FIG. 2E shows yet another example where the islands 203 and 205 have different shapes. Island 203 adjoins the gate structure 219 without overlapping each other. In other words, no part of island 203 is under a portion of the gate structure 219. Islands 203 and 205 are located within drift region 207, which starts at the gate structure edge. With non-overlapping embodiments, the width 221 of the adjoining island 203 may be larger to have the same effect as the "disposed under" island 203 of FIGS. 2A to 2D.

The various islands shown in FIGS. 2A to 2D are merely examples. The islands may be polygons, such as quadrilaterals such as those in FIGS. 2A, 2B, and 2C. The islands may have more than four sides or may be circular or irregular, such as those in FIG. 2D.

FIGS. 3A to 3C are cross-sectional views of a HEMT structure and depletion regions formed during various operations for a III-V semiconductor material based transistor without the islands of the present disclosure. FIG. 3A shows a small depletion region 301 under the gate structure 311 when the gate voltage is greater than the threshold voltage (a negative value), with no bias applied to the drain 313. The device of FIG. 3A is in an on state (normally on) and a current flows along the 2-DEG carrier channel 315.

In FIG. 3B, a gate voltage less than the threshold voltage is applied, with no bias at the drain 313, such that a larger depletion region 303 is formed. The depletion region 303 crosses the 2-DEG carrier channel boundary so that no current flows through the 2-DEG carrier channel 315. The device of FIG. 3B is in an off state.

FIG. 3C shows a device with a gate voltage less than the threshold voltage and bias at the drain so that the drain voltage is greater than zero. A much larger depletion region 305 is formed, the size of which correspond to the bias at the drain 313. When the drain 313 bias is sufficiently large, for example, larger than the breakdown voltage of the device, a large enough electric field is formed that is greater than a critical electrical field (Ec) of the material, either the bulk layer 317 or the donor-supply layer 319. The device can breakdown or pop and be rendered inoperable.

Figure 4B:
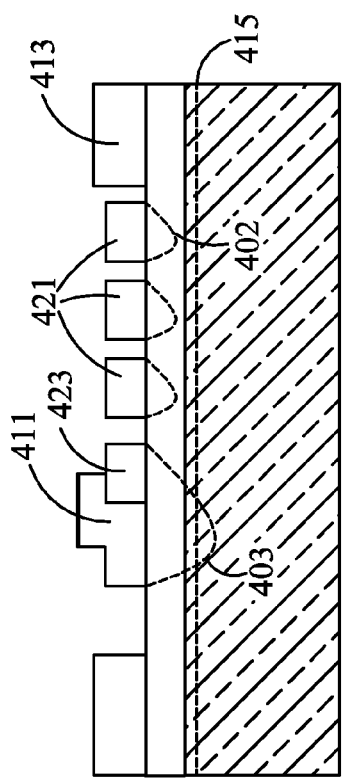
Figure 4C:
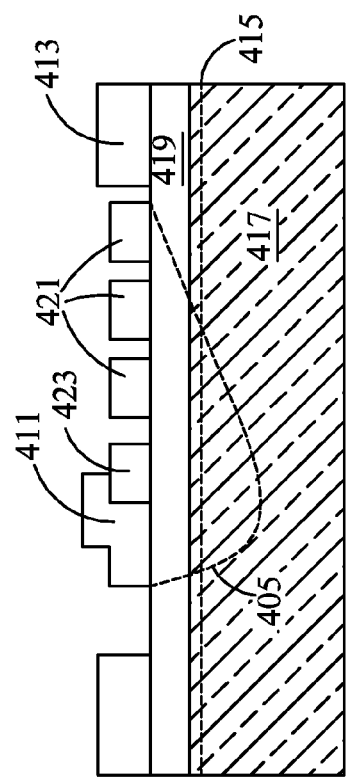

FIGS. 4A to 4C are cross-sectional views of a HEMT structure and depletion regions formed during various operations for a III-V semiconductor material based transistor with the islands of the present disclosure. FIG. 4A shows a small depletion region 401 under the gate structure 411 when the gate voltage is greater than the threshold voltage (a negative value), with no bias applied to the drain 413. Small depletion regions 402 are also shown under the islands 421. Note that the depletion region 401 under the gate 411 incorporates the effect of island 423. The device of FIG. 4A is in an on state (normally on) and a current flows along the 2-DEG carrier channel 415 because none of the depletion regions 401 and 402 crosses the 2-DEG carrier channel 415.

In FIG. 4A, a gate voltage less than the threshold voltage is applied, with no bias at the drain 313, such that a larger depletion region 403 and smaller depletion regions 402 are formed. The depletion region 403 cross the 2-DEG carrier channel boundary so that no current flows through the 2-DEG carrier channel 415. The device of FIG. 4B is in an off state.

FIG. 4C shows a device with a gate voltage less than the threshold voltage and bias at the drain so that the drain voltage is greater than zero. A much larger depletion region 405 is formed combining the smaller depletion regions under the islands 421. In some embodiments, depletion region 405 extends into the bulk layer 417 through the 2-DEG carrier channel 415 and the donor-supply layer 419. The size of depletion region 405 corresponds to the bias at the drain 413. For the same bias at the drain 413, the maximum depth of the depletion region 405 is smaller than that of depletion region 305 from FIG. 3C because the depletion region 405 is more distributed across the drift region.

Figure 5:
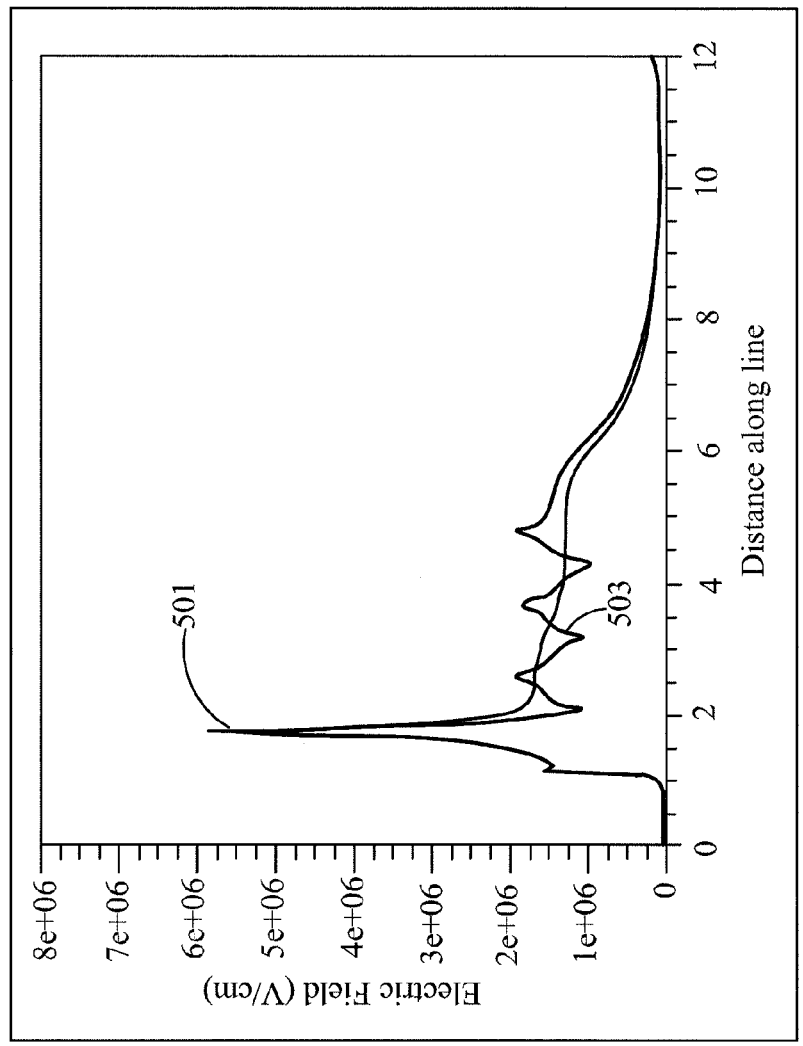
FIG. 5 is a plot of simulated peak surface electric field as a function of distance on the HEMT structures in accordance with various embodiments of the present disclosure.

FIG. 5 is a plot of simulated peak surface electric field as a function of distance on the HEMT structures in accordance with various embodiments of the present disclosure. Electric field in volts per centimeter is plotted against a distance along line across the HEMT. The simulation models a gate voltage of −5 volts and drain bias of 600 volts. The peak corresponds to the gate structure edge closest to the drain. Line 501 is a simulated result for a HEMT without the islands as disclosed herein. The peak electric field for line 501 is about 6E6 V/cm. Line 503 is a simulated result for a HEMT having three islands between the gate structure and the drain. The peak electric field for line 503 is about 5E6 V/cm, for a reduction of about 20%. This simulated result shows that the island structures disclosed herein do indeed reduce peak surface electric field in the HEMT. While the peak electric field value would vary depending on the structure modeled in the simulation, the relative effect of the islands is clear.

The embodiments of the present disclosure may have other variations. For example, the islands may include more than one material, such as a layer of nickel oxide over a layer of gallium nitride. Certain embodiments of the present disclosure have several advantageous features. The use of various doping species allows fine-tuning of the islands, and hence the breakdown voltage, while minimizing adverse effects to other electrical properties, such as maximum forward current or leakage current.

In one aspect, the present disclosure pertains to a circuit structure having a substrate, an unintentionally doped gallium nitride (UID GaN) layer over the substrate, a donor-supply layer over the UID GaN layer, a gate structure, a drain, and a source over the donor-supply layer, and a plurality of islands over the donor-supply layer between the gate structure and the drain. The gate structure disposed between the drain and the source. The gate structure is partially disposed over at least a portion of at least one of the plurality of islands. The islands are p-type doped islands or Schottky material islands.

In another aspect, the present disclosure pertains to a circuit structure having a substrate, a III-V compound semiconductors layer over the substrate, a donor-supply layer over the III-V compound semiconductors layer, a plurality of p-type doped islands over a drift portion of the donor-supply layer, a gate structure adjoining at least portion of one of the plurality of p-type doped islands at an edge of the drift portion, a drain over the donor-supply layer at an opposite edge of the drift portion from the gate structure, the drain being isolated from the plurality of p-type doped islands, and a source over the donor-supply layer, the gate structure being positioned between the source and the drain away from the drift portion and closer to the gate structure than the drain. The drift portion region of the donor-supply layer occupies at least 50% of the donor-supply layer.

In yet another aspect, the present disclosure pertains to a method for making the circuit structure. The method includes providing a substrate, epitaxially growing an UID GaN layer over the substrate, epitaxially growing an undoped AlGaN layer over the UID GaN layer, forming one or more islands over a portion of the undoped AlGaN layer, and forming source/drain and gate structure. The islands may be formed by epitaxially growing a p-type doped film and etching to a pattern, depositing suitable p-type material and etching to a pattern, or depositing suitable Schottky metal and etching to a pattern.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit structure comprising:
a substrate;
a bulk layer, over the substrate, comprising gallium nitride;
a donor-supply layer over the bulk layer;
a gate structure, a drain, and a source over the donor-supply layer, said gate structure disposed between the drain and the source;
a plurality of islands over the donor-supply layer between the gate structure and the drain;
wherein the gate structure is partially over at least a portion of at least one of the plurality of islands, and a largest island of the plurality of islands is partially disposed under the gate structure.

2. The circuit structure of claim 1, wherein the plurality of islands is a plurality of p-type doped islands.

3. The circuit structure of claim 2, wherein the plurality of p-type doped islands comprise gallium nitride, aluminum gallium nitride, nickel oxide, or zinc oxide.

4. The circuit structure of claim 3, wherein the p-type dopant in the plurality of p-type doped islands comprises at least one of carbon, iron, magnesium, calcium, beryllium, and zinc.

5. The circuit structure of claim 4, wherein a p-type dopant concentration is about 1E15 to 1E17/cm$^3$.

6. The circuit structure of claim 1, wherein the plurality of islands comprise a plurality of Schottky materials.

7. The circuit structure of claim 6, wherein the Schottky materials comprise titanium, titanium nitride, titanium tungsten, or tungsten.

8. The circuit structure of claim 1, wherein one or more of the plurality of islands are quadrilaterals in a top view.

9. The circuit structure of claim 1, the plurality of islands and a portion of the donor-supply layer not covered by the plurality of islands form a checkered pattern.

10. The circuit structure of claim 1, wherein the plurality of islands cover about 40% to about 75% of the portion of the donor-supply layer between the gate structure and the drain.

11. The circuit structure of claim 1, wherein the donor-supply layer comprises undoped aluminum nitride or undoped aluminum gallium nitride.

12. The circuit structure of claim 1, wherein a thickness of one or more of the plurality of islands is about 3 nanometer to about 100 nanometers.

13. A circuit structure comprising:
a substrate;
a III-V compound semiconductors layer over the substrate;
a donor-supply layer over the III-V compound semiconductors layer;
a plurality of p-type doped islands over a drift portion of the donor-supply layer;
a gate structure adjoining at least a side surface of one of the plurality of p-type doped islands at an edge of the drift portion, with a proviso that the gate structure does not overlap a top surface of any of the plurality of p-type doped islands;
a drain over the donor-supply layer at an opposite edge of the drift portion from the gate structure, the drain being isolated from the plurality of p-type doped islands; and
a source over the donor-supply layer, the gate structure being positioned between the source and the drain;
wherein a drift region of the donor-supply layer occupies at least 50% of the donor-supply layer.

14. The circuit structure of claim 13, wherein the III-V compound semiconductor comprises gallium nitride, and the donor-supply layer comprises $Al_xGa_{(1-x)}N$, wherein x is between 0 and 1.

15. The circuit structure of claim 13, wherein the plurality of p-type doped islands comprise gallium nitride, aluminum gallium nitride, nickel oxide, or zinc oxide.

16. The circuit structure of claim 15, wherein a p-type dopant in the plurality of p-type doped islands comprises at least one of carbon, iron, magnesium, calcium, beryllium, and zinc.

17. The circuit structure of claim 13, wherein the substrate comprises silicon, silicon carbide, or sapphire.

18. The circuit structure of claim 13, wherein the plurality of p-type doped islands cover about 40% to about 75% of the drift portion of the donor-supply layer.

19. The circuit structure of claim 13, wherein a width ratio of the p-type doped island and an adjacent portion of the drift portion without an p-type doped island thereon is about 1:1.

* * * * *